United States Patent
Shibata et al.

(10) Patent No.: US 9,343,920 B2
(45) Date of Patent: May 17, 2016

(54) STORAGE CAPACITY MANAGEMENT SYSTEM

(75) Inventors: Tomohiro Shibata, Saitama (JP); Futoshi Ogura, Saitama (JP); Shinichi Kitajima, Saitama (JP); Yukihiro Fukushima, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 463 days.

(21) Appl. No.: 13/809,365

(22) PCT Filed: Jul. 12, 2011

(86) PCT No.: PCT/JP2011/065905
§ 371 (c)(1),
(2), (4) Date: Jan. 9, 2013

(87) PCT Pub. No.: WO2012/008462
PCT Pub. Date: Jan. 19, 2012

(65) Prior Publication Data
US 2013/0113433 A1    May 9, 2013

(30) Foreign Application Priority Data

Jul. 13, 2010   (JP) ................................. 2010-158743

(51) Int. Cl.
| | |
|---|---|
| B60L 3/00 | (2006.01) |
| H02J 7/00 | (2006.01) |
| B60L 11/14 | (2006.01) |
| B60L 11/18 | (2006.01) |
| B60W 20/00 | (2016.01) |
| G01R 31/36 | (2006.01) |

(Continued)

(52) U.S. Cl.
CPC ................. *H02J 7/007* (2013.01); *B60L 11/14* (2013.01); *B60L 11/1861* (2013.01);

(Continued)

(58) Field of Classification Search
CPC ..... B60W 2510/248; G01R 31/36; B60L 3/00
USPC ........................................................ 320/134
See application file for complete search history.

(56) References Cited

U.S. PATENT DOCUMENTS 6,166,517 A * 12/2000 Wakashiro et al. ........... 320/104
7,443,139 B2 * 10/2008 Mitsui ................ G01R 31/3624
                                                             320/132

(Continued)

FOREIGN PATENT DOCUMENTS

JP      2000-030753 A      1/2000
JP      2000-324616 A      11/2000

(Continued)

OTHER PUBLICATIONS

International Search Report, PCT/JP2011/065905 dated Oct. 18, 2011.

*Primary Examiner* — Samuel Berhanu
*Assistant Examiner* — Tessema Kebede
(74) *Attorney, Agent, or Firm* — Westerman, Hattori, Daniels & Adrian, LLP

(57) ABSTRACT

A storage capacity management system for a battery provided in a vehicle having an electric motor as a drive source includes a deteriorated state estimating unit that estimates a deteriorated state of the battery, a zone setting unit that sets a storage capacity where the battery can be used into a plurality of zones in accordance with a deteriorated state of the battery, a charged state calculating unit that calculates a charged state of the battery, a zone determination unit that determines to which zone of the plurality of zones set by the zone setting unit the charged state of the battery belongs, and a control instructing unit that instructs to execute a control associated with the charge or discharge of the battery in accordance with the zone determined by the zone determination unit.

15 Claims, 9 Drawing Sheets

(51) Int. Cl.
 H01M 10/44 (2006.01)
 H01M 10/48 (2006.01)
 B60W 10/06 (2006.01)

(52) U.S. Cl.
 CPC ........... B60L 11/1862 (2013.01); B60W 20/00 (2013.01); G01R 31/3679 (2013.01); H01M 10/44 (2013.01); H01M 10/48 (2013.01); *B60L 2240/547* (2013.01); *B60L 2240/549* (2013.01); *B60W 10/06* (2013.01); *B60W 2510/244* (2013.01); *B60W 2510/248* (2013.01); *H01M 2220/20* (2013.01); *Y02T 10/70* (2013.01); *Y02T 10/7005* (2013.01); *Y02T 10/705* (2013.01); *Y02T 10/7044* (2013.01); *Y02T 10/7077* (2013.01)

(56) References Cited

U.S. PATENT DOCUMENTS

| | | | |
|---|---|---|---|
| 7,610,124 B2 * | 10/2009 | Wakashiro et al. | 701/22 |
| 8,125,187 B2 * | 2/2012 | Tatsumi | 320/132 |
| 2002/0030494 A1 * | 3/2002 | Araki | G01R 31/361 324/427 |
| 2002/0062183 A1 * | 5/2002 | Yamaguchi | B60K 6/46 701/22 |
| 2004/0119441 A1 * | 6/2004 | Koo | B60K 6/46 320/104 |
| 2007/0118255 A1 * | 5/2007 | Wakashiro et al. | 701/22 |

FOREIGN PATENT DOCUMENTS

| | | |
|---|---|---|
| JP | 2001-157369 A | 6/2001 |
| JP | 3705008 B2 | 8/2005 |
| JP | 3754254 B2 | 12/2005 |
| JP | 3915258 B2 | 2/2007 |
| JP | 2007-151216 A | 6/2007 |
| JP | 2009-292179 A | 12/2009 |
| JP | 2010-035350 A | 2/2010 |
| JP | 2010220391 A * | 9/2010 |
| WO | WO 2010/058839 A1 | 5/2010 |

\* cited by examiner

STORAGE CAPACITY MANAGEMENT SYSTEM

CROSS-REFERENCED TO RELATED APPLICATION

This application is a National Stage entry of International Application PCT/JP2011/065905, filed Jul. 12, 2011, which claims priority to Japanese Patent Application No. 2010-158743, filed Jul. 13, 2010, the disclosure of the prior application(s) are hereby incorporated in their entirety by reference.

TECHNICAL FIELD

The present invention relates to a storage capacity management system for a battery that is installed in a vehicle having an electric motor as a drive source.

BACKGROUND ART

A battery is mounted in a vehicle such as an EV (Electric Vehicle) or an HEV (Hybrid Electric Vehicle) for supplying electric power to an electric motor. A plurality of storage cells that are connected in series are provided in the battery. Storage batteries such as nickel-metal hydride batteries or lithium ion batteries are used for storage cells. However, in order to use the storage batteries safely, the state of charge (SOC) of the battery needs to be monitored at all times so as to be controlled to prevent overcharge or over discharge. Note that the SOC of a battery is calculated based on accumulated values of charge and discharge currents and/or a terminal voltage of the battery. An error is included in the SOC (the control SOC) that is calculated based on this method, and there exists a deviation between the control SOC and the SOC in reality (the actual SOC).

In a monitoring system for monitoring the SOC of a battery mounted in a vehicle such as an HEV, the range of a control SOC where the battery can be used (a lower limit SOC to an upper limit SOC) is divided into a plurality of areas (hereinafter, referred to as "zones") to monitor the battery. FIG. 8 is a diagram showing an example of a relationship between a range of a control SOC where a battery can be used and a plurality of zones thereof. As shown in FIG. 8, the range of the control SOC where the battery can be used is divided into four zones including Zone C, Zone B, Zone A and Zone D from the lower limit SOC side to the upper limit SOC side. Zone A is divided into three classes including Class L, Class M and Class H from the lower limit side to the upper limit side. Zone D is divided into two classes including Class L and Class H from the lower limit SOC side to the upper limit SOC side. A control unit for the battery executes the following controls depending upon the zone or class to which the control SOC of the battery belongs.

The battery in Zone C is in such a charged state that an internal combustion engine can be started by an electric motor (an engine start enabling state). Consequently, the control unit prohibits the discharge of the battery in Zone C but permits the discharge for starting the internal combustion engine by the electric motor. Additionally, the control unit prohibits an EV driving in which the vehicle is driven only by a driving force from the electric motor and an assist in driving the vehicle by the driving force of the electric motor. Note that the control unit prohibits totally the discharge of the battery whose control SOC is lower than a lower limit of Zone C (the lower limit SOC) and executes forced charging.

The battery in Zone B is in such a charged state that ensures the supply of electric power to the electric motor when the vehicle is climbing an uphill or starts (a hill climbing/start ensuring state). Consequently, the control unit prohibits the discharge of the battery in Zone B. Additionally, the control unit prohibits the EV driving and restricts the assist by the electric motor.

The battery in Class L in Zone A (hereinafter, referred to as "Zone AL") is in such a charged stat (a sufficiently charged state) that permits the charge of the battery by driving the electric motor by the internal combustion engine and which restricts the EV driving (the driving based on the driving force from the electric motor only). Consequently, the control unit executes a standard control on a charge side on the battery in Zone AL. Additionally, the control unit restricts the EV driving and permits the assist by the electric motor.

Additionally, the battery in Class M in Zone A (hereinafter, referred to as "Zeon AM") is in such a charged state that permits the charge of the battery by driving the electric motor by the internal combustion engine and which permits the EV driving (a flat or urban area general road driving enabling state). Consequently, the control unit executes a standard control on the battery in Zone AM. In addition, the control unit permits not only the EV driving but also the assist by the electric motor.

In addition, the battery in Class H in Zone A (hereinafter, referred to as "Zone AH") is in such a charged state that restricts the charge of the battery by driving the electric motor by the internal combustion engine and permits the EV driving (a sufficient regenerative state with charge restricted). Consequently, the control unit executes a standard control on a discharge side on the battery in Zone AH. Additionally, the control unit permits the EV driving so as to enhance the assist by the electric motor.

The battery in Class L in Zone D (hereinafter, referred to as "Zone DL") is in such a charged state that restricts the charge of the battery by driving the electric motor by the internal combustion engine (a discharge side enlarging state with charge restricted). Consequently, the control unit restricts the charge of the battery in Zone DL. Additionally, the control unit enhances the EV driving and the assist by the electric motor.

In addition, the battery in Class H in Zone D (hereinafter, referred to as Zone DH") is in such a charged state that prohibits the charge of the battery by driving the electric motor by the internal combustion engine and restricts the regenerative operation of the electric motor during deceleration (an overcharge and lack of deceleration preventing state). Consequently, the control unit prohibits the charge of the battery in Zone DH and restricts the regeneration thereof. Note that the control units prohibits the charge and regenerative operation of the battery whose control SOC is higher than an upper limit of Zone DH (the upper limit SOC) and discharges the battery in a forced fashion.

RELATED ART DOCUMENT

Patent Document

Patent Document 1: Japanese Patent No. 3705008
Patent Document 2: Japanese Patent No. 3754254
Patent Document 3: Japanese Patent No. 3915258
Patent Document 4: JP-A-2010-035350

SUMMARY OF THE INVENTION

Problems to be Solved by the Invention

A battery gradually deteriorates according to conditions, a frequency and a length of time when the battery is used. Then, the available capacity of the battery is lowered in association with the deterioration of the battery. Namely, the available capacity of the battery is gradually lowered from an initial stage where the battery is started to be used towards a final stage where a service life of the battery nearly ends. On the other hand, the range (the lower limit SOC to the upper limit SOC) of the control SOC of the battery that has been described before does not change in terms of value even when the available capacity changes. In this way, although the range of the control SOC of the battery does not change from the initial stage to the final stage, the available capacity deteriorates. FIG. 9 is a diagram showing an example of a relationship between a change in available capacity of a battery and a plurality of zones of a control SOC that change in accordance with the change in state of the battery from an initial stage to a final stage thereof.

As shown in FIG. 9, a range of a capacity that is allocated to each of the zones decreases by a uniform ratio as the available capacity of the battery decreases in association with the deterioration of the battery. Note that although not shown, a range of a capacity that is allocated to each of classes of Zone A also decreases by a uniform ratio. However, when the range of a capacity that is allocated to Zone C that is set in the engine start enabling state decreases, it is possible that the battery cannot supply necessary electric power to start the internal combustion engine to the electric motor. Additionally, when the range of a capacity that is allocated to Zone B that is set in the hill climbing/start ensuring state decreases, it is possible that the hill climbing performance or starting performance of the vehicle decreases. Further, when the range of a capacity allocated to Zone AM where the battery is charged or discharged with the best fuel economy, it is possible that the fuel economy deteriorates compared with that in the initial stage of the battery.

An object of the invention is to provide a storage capacity management system that enables the performance of a battery to be exhibited sufficiently while suppressing the effect of deterioration of the battery to a lowest level.

Means for Solving the Problems

With a view to solving the problem to attain the object above, according to an invention of Claim 1, there is provided a storage capacity management system (for example, a storage capacity management system 113 in an embodiment) for a battery (for example, a battery 103 in the embodiment) provided in a vehicle having an electric motor (for example, an electric motor M in the embodiment) as a drive source, characterized by including a deteriorated state estimating unit (for example, an internal resistance calculating unit 153 in the embodiment) that estimates a deteriorated state of the battery, a zone setting unit (for example, a zone setting unit 155 in the embodiment) that sets a storage capacity where the battery can be used into a plurality of zones in accordance with a deteriorated state of the battery, a charged state calculating unit (for example, a control SOC calculating unit 157 in the embodiment) that calculates a charged state of the battery, a zone determination unit (for example, a battery zone determination unit 159 in the embodiment) that determines to which zone of the plurality of zones set by the zone setting unit the charged state of the battery belongs, and a control instructing unit (for example, a control instructing unit 161 in the embodiment) that instructs to execute a control associated with the charge or discharge of the battery in accordance with the zone determined by the zone determination unit, and characterized in that a range of a storage capacity of at least one predetermined zone of the plurality of zones set by the zone setting unit stays constant irrespective of the deteriorated state of the battery, whereas ranges of storage capacities of zones other than the predetermined zone change according to the deteriorated state of the battery.

Further, a storage capacity management system according to an invention set forth in Claim 2 is characterized in that the control instructing unit instructs to execute a different control in association with the charge or discharge of the battery depending upon to which zone of the plurality of zones the charged state of the battery belongs.

Further, a storage capacity management system according to an invention set forth in Claim 3 is characterized in that the ranges of the storage capacities of the zones other than the predetermined zone get narrower as the deteriorated state of the battery gets worse.

Further, a storage capacity management system according to an invention set forth in Claim 4 is characterized in that the control instructing unit restricts or prohibits the discharge of the battery in the predetermined zone.

Further, a storage capacity management system according to an invention set forth in Claim 5 is characterized in that the vehicle has an internal combustion engine as a drive source in addition to the electric motor and in that the control instructing unit prohibits the discharge of the battery but permits the discharge of the battery for starting the internal combustion engine by the electric motor in the predetermined zone.

Further, a storage capacity management system according to an invention set forth in Claim 6 is characterized in that the predetermined zone is the zone where the battery is charged or discharged with a best fuel economy in the plurality of zones.

Further, a storage capacity management system according to an invention set forth in Claim 7 is characterized in that the vehicle has an internal combustion engine that can drive the electric motor so as to charge the battery and in that the control instructing unit prohibits the charge of the battery by driving the electric motor by the internal combustion engine and restricts a regenerative operation of the electric motor while the vehicle is being decelerated.

Further, a storage capacity management system according to an invention set forth in Claim 8 is characterized in that when restricting the regenerative operation of the electric motor, the control instructing unit changes a ratio of a regenerative braking force to an overall braking force while the vehicle is being decelerated according to the charged state of the battery.

Further, a storage capacity management system according to an invention set forth in Claim 9 is characterized in that the control instructing unit restricts the charge of the battery by driving the electric motor by the internal combustion engine in the zones other than the predetermined zone.

Further, a storage capacity management system according to an invention set forth in Claim 10 is characterized in that the vehicle has an internal combustion engine (for example, the internal combustion engine E) as a drive source in addition to the electric motor and in that the control instructing unit permits the charge of the battery and restricts the driving of the vehicle based only on a driving force from the electric motor in the zones other than the predetermined zone.

Further, a storage capacity management system according to an invention set forth in Claim 11 is characterized in that the zones other than the predetermined zone are the zones where the battery is charged or discharged with a best fuel economy in the plurality of zones and a contraction ratio of the range of the storage capacity becomes the smallest therein.

Advantage of the Invention

According to the storage capacity management system set forth in Claims 1 to 11, the performance of the battery can be exhibited sufficiently while the influence of the deterioration is suppressed to a minimum level.

According to the storage capacity management system set forth in Claim 4, the hill climbing performance and the starting performance of the vehicle can be exhibited sufficiently.

According to the storage capacity management system set forth in Claim 5, the starting performance of the electric motor by the internal combustion engine can be exhibited sufficiently.

According to the storage capacity management system set forth in Claim 6, the performance of the battery can be exhibited sufficiently without deterioration in fuel economy.

According to the storage capacity management system set forth in Claim 8, a drastic change in braking force can be prevented.

According to the storage capacity management system set forth in Claim 11, the performance of the battery can be exhibited sufficiently without deterioration in fuel economy.

MODES FOR CARRYING OUT THE INVENTION

Hereinafter, an embodiment of the invention will be described by reference to the drawings. A storage capacity management system of this embodiment that will be described below is installed in a vehicle such as an EV (Electric Vehicle) or an HEV (Hybrid Electric Vehicle) in which an electric motor that is driven by electric power supplied from a battery is provided as a drive source.

Figure 1:
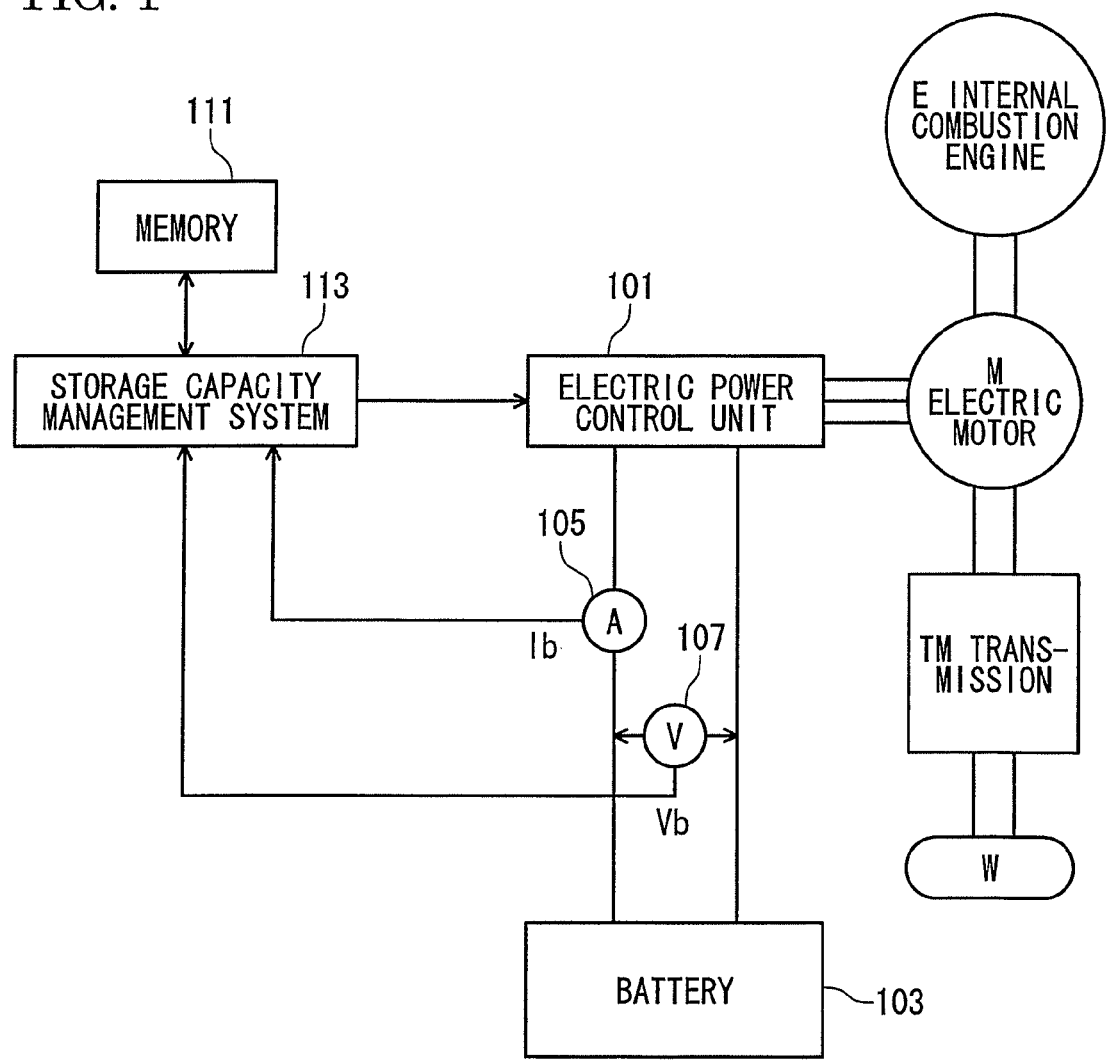
FIG. 1 is a schematic block diagram of an HEV in which a storage capacity management system of an embodiment of the invention is installed.

FIG. 1 is a schematic block diagram of an HEV in which the storage capacity management system of this embodiment is installed. The HEV (hereinafter, referred to simply as a "vehicle") shown in FIG. 1 includes mainly an internal combustion engine E, an electric motor M, a transmission TM, driven wheels W, an electric power control unit 101, a battery 103, a current sensor 105, a voltage sensor 107, a memory 111, and a storage capacity management system 113. In this vehicle, a driving force from at least one of the internal combustion engine E and the electric motor M is transmitted to the driven wheels W by way of the transmission TM. Additionally, when a driving force is transmitted from the driven wheels W side to the electric motor M side during deceleration, the electric motor M functions as a generator to generate a so-called regenerated braking force, whereby the kinetic energy of a vehicle body is recovered into the battery 103 as regenerated energy. Further, the electric motor M is driven as the generator by the output of the internal combustion engine E in accordance with the driving state of the vehicle, and generated energy is produced.

The electric power control unit 101 controls the supply of electric power from the battery 103 to the electric motor M that is associated with the driving of the electric motor M and the recovery of regenerated energy from the electric motor M to the battery 103.

The battery 103 is, for example, a NiMH (nickel-metal hydride) battery in which a metal hydride is used as a cathode active material or a lithium ion battery, an electrical double layer capacitor or a condenser. The battery 103 is repeatedly charged and discharged within a range (a lower limit SOC to an upper limit SOC) of a control SOC where the battery can be used.

The current sensor 105 detects a charge/discharge current Ib of the battery 103. The charge/discharge current Ib includes a discharge current that is supplied from the battery 103 to the electric motor M and a charge current that is supplied from the electric motor M to the battery 103 which executes a regenerating operation. The voltage sensor 107 detects a terminal voltage Vb (also referred to as CCV (Closed Circuit Voltage)) of the battery 103. The detection timing of the current sensor 105 and the detection timing of the voltage sensor 107 substantially coincide.

The memory 111 stores information on the charge/discharge current Ib that is detected by the current sensor 105 and information on the terminal voltage Vb that is detected by the voltage sensor 107. Additionally, the memory 111 stores a zone setting map that corresponds to an internal resistance of the battery 103. The zone setting map will be described later.

The storage capacity management system 113 obtains information on the charge/discharge current Ib that is detected by the current sensor 105 and information on the terminal voltage Vb that is detected by the voltage sensor 107 and stores them in the memory 111. Additionally, the storage capacity management system 113 sets a range of a storage capacity for each of a plurality of zones (Zone C, Zone B, Zone A, Zone D) that make up the range (the lower limit SOC to the upper limit SOC) of the control SOC where the battery can be used and each of classes (Class L, Class M, Class H) of Zone A. In addition, the storage capacity management system 113 calculates a control SOC of the battery 103 based on an open circuit voltage (OCV) of the battery 103. The storage capacity management system 113 determines to which zone or class the battery 103 belongs based on the control SOC so calculated. Further, the storage capacity management system 113 controls the electric power control unit 101 according to the zone or class determined.

Figure 2:
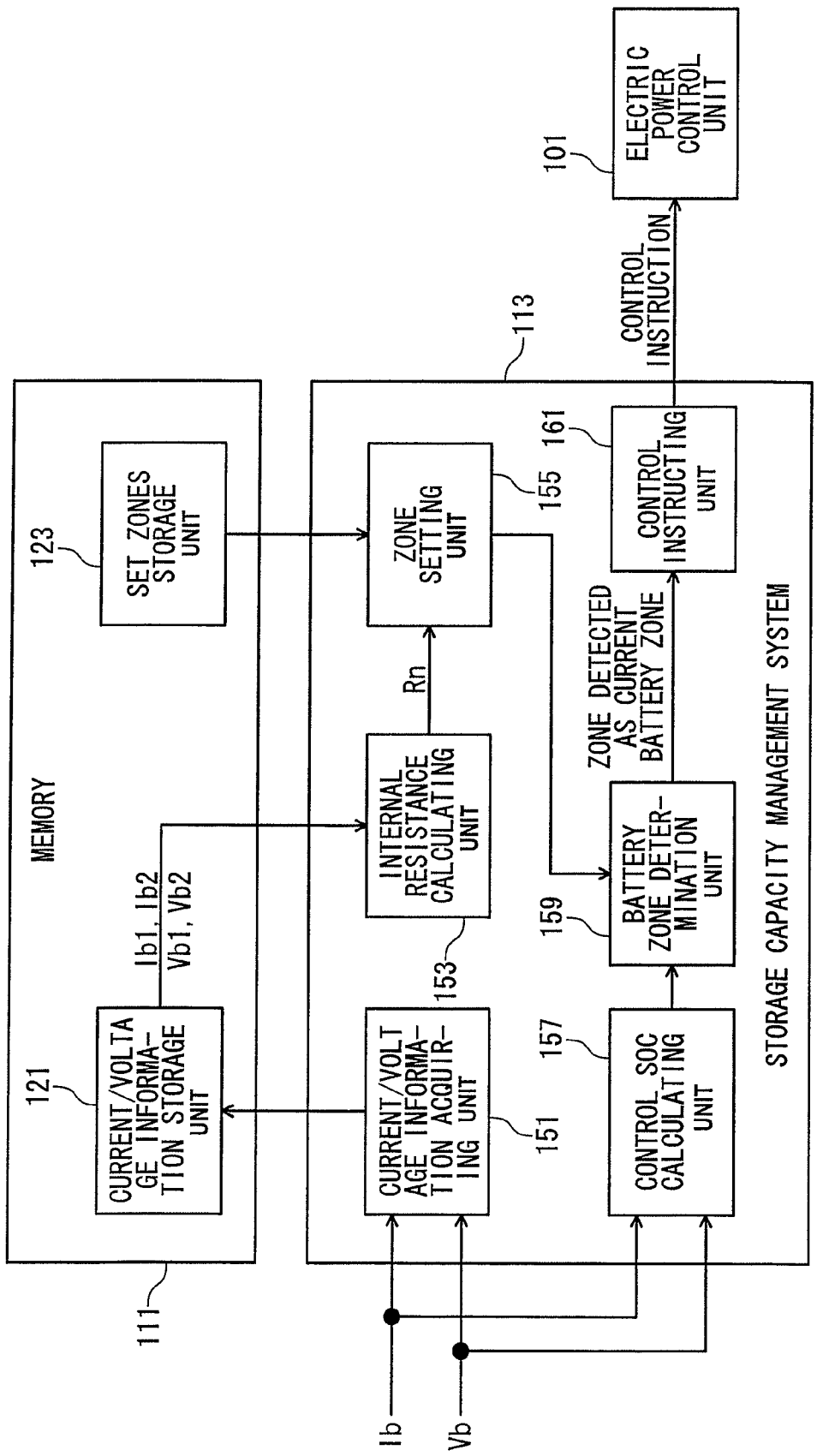
FIG. 2 is a block diagram showing internal configurations of a memory 111 and a storage capacity management system 113.

FIG. 2 is a block diagram showing internal configurations of the memory 111 and the storage capacity management system 113. As shown in FIG. 2, the memory 111 has a current/voltage information storage unit 121 and a set zones storage unit 123. The current/voltage information storage unit 121 stores the charge/discharge current Ib and the terminal voltage Vb. Additionally, the set zones storage unit 123 stores a zone setting map shown in FIG. 3 or a zone setting map shown in FIG. 4 in which a range of a storage capacity for each zone is set that corresponds to the internal resistance of the battery 103.

Figure 3:
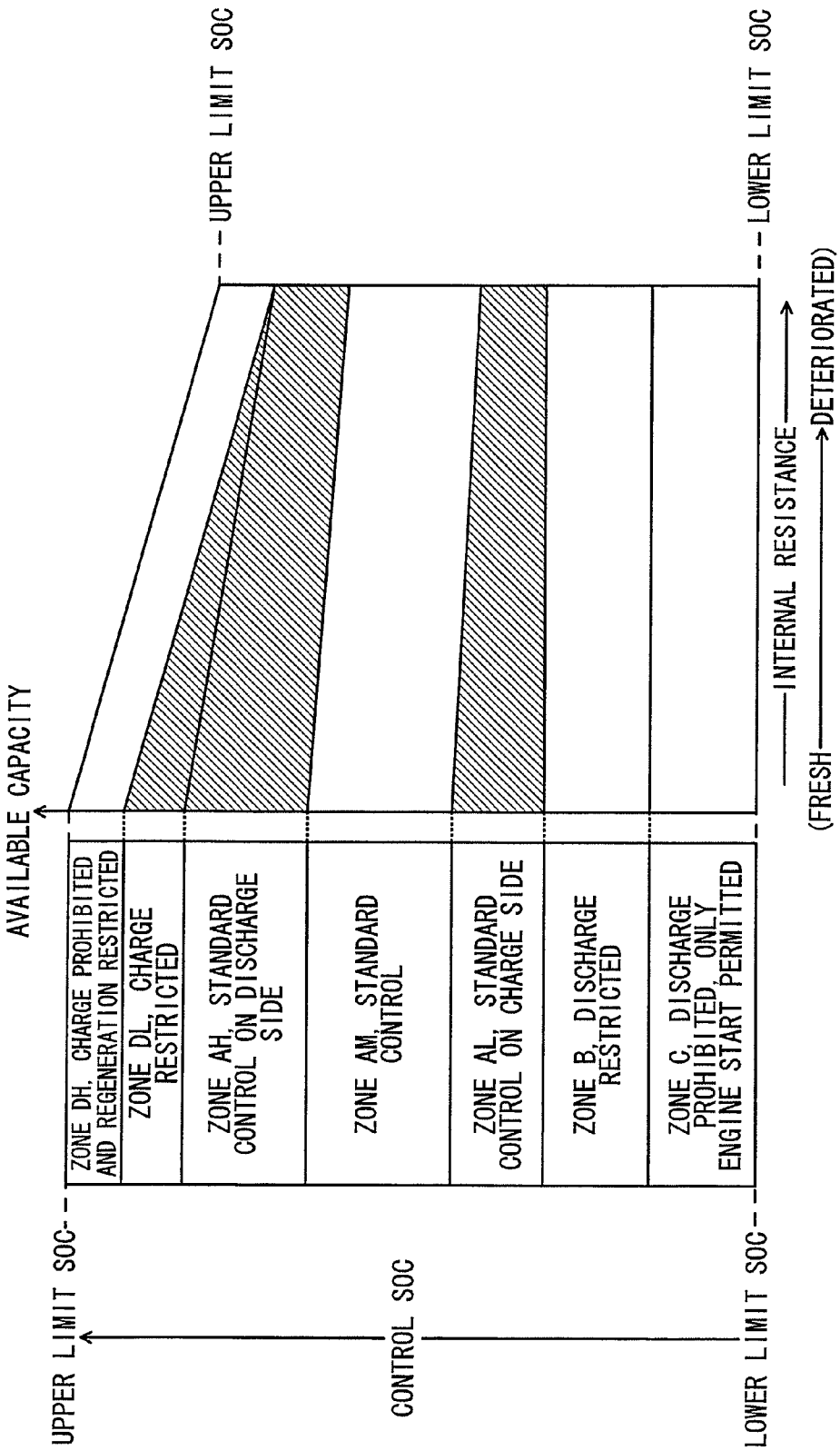
FIG. 3 is a diagram showing an example of a zone setting map that is set to change in accordance with changes in control SOC and internal resistance that change in accordance with a change in available capacity of a battery 103.

FIG. 3 is a diagram showing an example of a zone setting map that is set to change in accordance with changes in control SOC and internal resistance that change in accordance with a change in available capacity of the battery 103. As shown in FIG. 3, in the zone setting map, as the internal resistance of the battery 103 increases, as shown by oblique lines, ranges of storage capacities of Zone AL (Class L in Zone A), Zone AH (Class H in Zone A) and Zone DL (Class L in Zone D) are narrowed. On the other hand, ranges of storage capacities of Zone C, Zone B, Zone AM (Class M in Zone A) and Zone DH (Class H in Zone D) do not change to stay constant even when the internal resistance of the battery changes.

Figure 4:
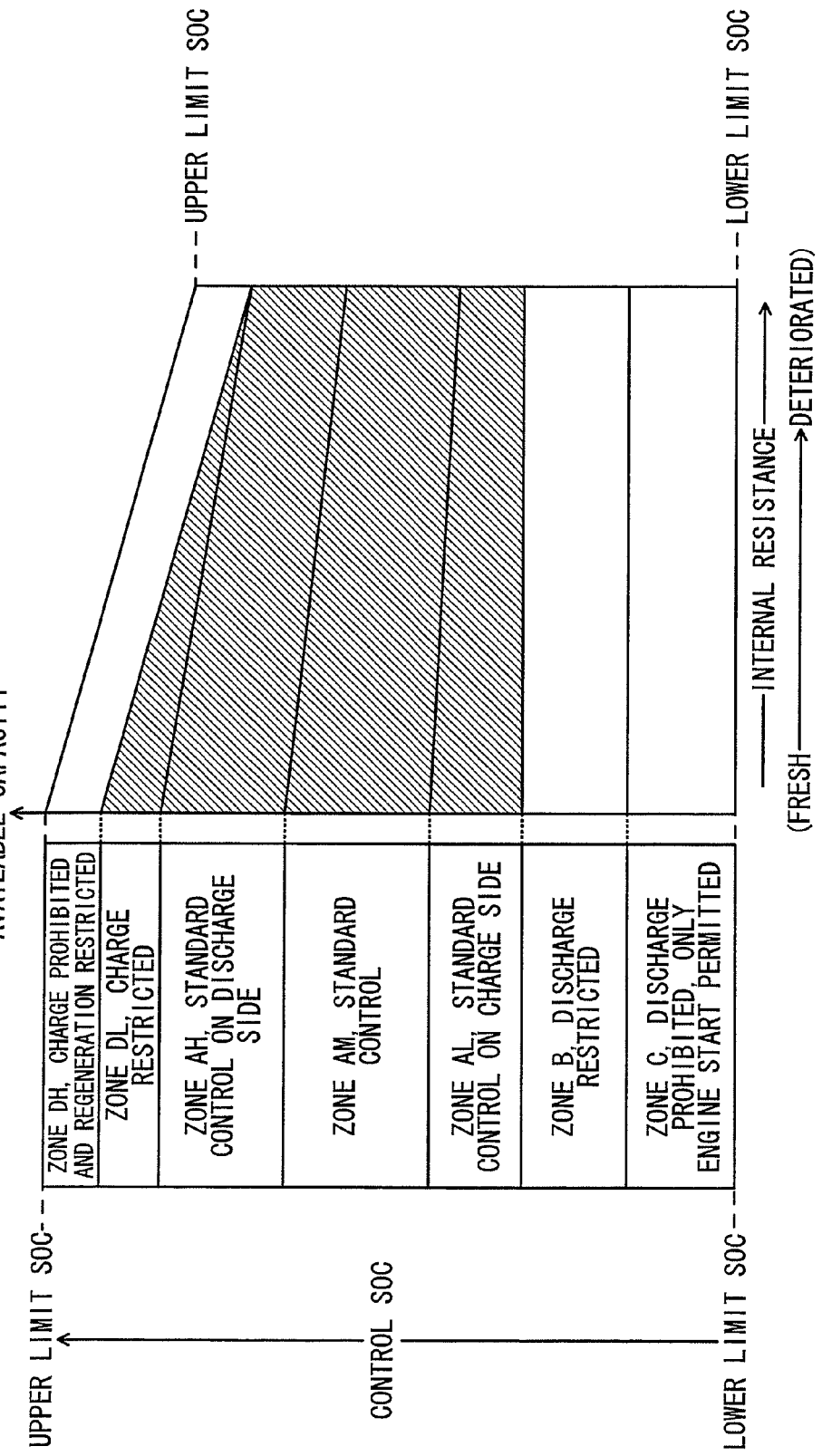
FIG. 4 is a diagram showing another example of a zone setting map that is set to change in accordance with changes in control SOC and internal resistance that change in accordance with a change in available capacity of the battery 103.

FIG. 4 is a diagram showing another example of a zone setting map that is set to change in accordance with changes in control SOC and internal resistance that change in accordance with a change in available capacity of the battery 103. As shown in FIG. 4, in the zone setting map, as shown by oblique lines, as the internal resistance of the battery 103 increases, ranges of storage capacities of Zone AL, Zone AM, Zone AH and Zone DL are narrowed. On the other hand, ranges of storage capacities of Zone C, Zone B and Zone DH do not change to stay constant even when the internal resistance of the battery changes. Note that the contraction ratio of the range of Zone AM is the smallest in the contraction ratios of the ranges of Zone AL, Zone AM, Zone AH and Zone DL.

As shown in FIG. 2, the storage capacity management system 113 has a current/voltage information acquiring unit 151, an internal resistance calculating unit 153, a zone setting unit 155, a control SOC calculating unit 157, a battery zone determination unit 159 and a control instructing unit 161.

The current/voltage acquiring unit 151 acquires information on a charge/discharge current Ib detected by the current sensor 105 and information on a terminal voltage Vb detected by the voltage sensor 107 and stores them in the current/voltage storage unit 121 of the memory 111.

The internal resistance calculating unit 153 reads out charge/discharge currents Ib1, Ib2 and terminal voltages Vb1, Vb2 that have been detected before from the current/voltage information storage unit 121 and calculates an internal resistance Rn of the battery 103 by the following expression (1).

$$Rn = (Vb2 - Vb1)/(Ib2 - Ib1) \quad (1)$$

The zone setting unit 155 sets ranges for the storage capacities of the respective zones 123 that correspond to the internal resistance Rn calculated.

The control SOC calculating unit 157 calculates an open circuit voltage (OCV) of the battery 103 by the following expression (2) based on the internal resistance Rn calculated by the zone setting unit 155, the charge/discharge current Ib detected by the current sensor 105 and the terminal voltage Vb detected by the voltage sensor 107.

$$OCV = Vb + Ib \times Rn \quad (2)$$

Figure 5:
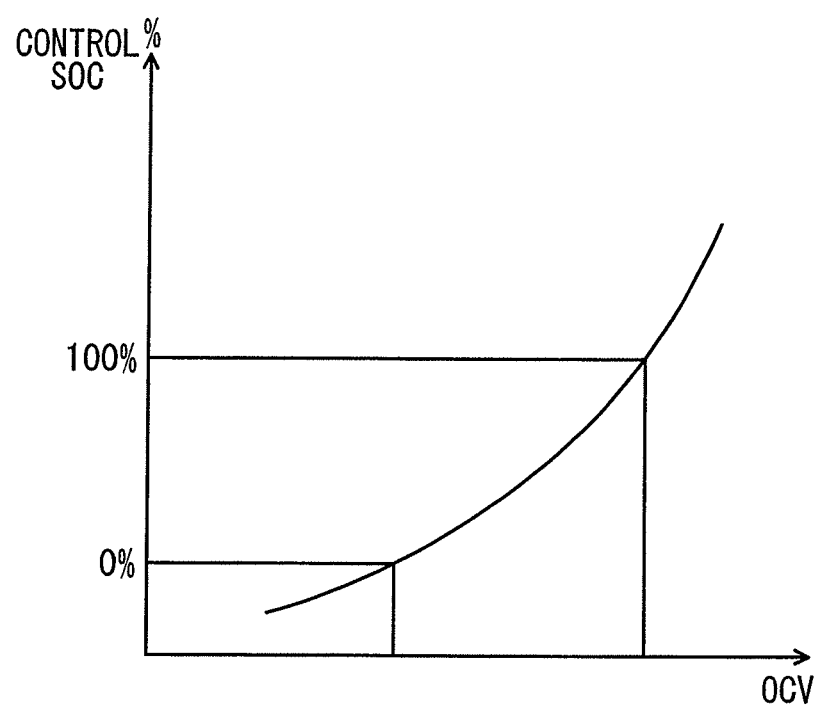
FIG. 5 is a graph showing a relationship between an open circuit voltage OCV and the control SOC of the battery 103.

The battery zone determination unit 159 calculates a control SOC of the battery 103 that corresponds to the open circuit voltage OCV by reference to a graph shown in FIG. 5. FIG. 5 is a graph showing a relationship between the open circuit voltage OCV and the control SOC. Further, the battery zone determination unit 159 determines to which zone the battery 103 belongs based on the zone set by the zone setting unit 155 and the control SOC calculated.

The control instructing unit 161 issues to the electric power control unit 101 an instruction on control based on vehicle speed, accelerator pedal opening, brake pedal effort, control SOC, and shift position in accordance with the zone determined by the battery zone determination unit 159. Namely, as is described in the "Background Art," the control instructing unit 161 prohibits the discharge of the battery 103 that is in Zone C but permits the discharge of the battery 103 for starting the internal combustion engine E by the electric motor M. Additionally, the control instructing unit 161 restricts the discharge of the battery 103 that is in Zone B.

Additionally, the control instructing unit 161 permits the charge of the battery 103 by driving the electric motor M by the internal combustion engine E when the battery 103 is in Zone AL and restricts an EV driving (a driving based on a driving force from the electric motor M only). In addition, the control instructing unit 161 restricts the charge of the battery 103 by driving the electric motor M by the internal combustion engine E when the battery 103 is in Zone AM and permits the EV driving. In addition to, the control instructing unit 161 restricts the charge of the battery 103 by driving the electric motor M by the internal combustion engine E when the battery 103 is in Zone AH and permits the EV driving.

Additionally, the control instructing unit 161 restricts the charge of the battery 103 by driving the electric motor M by the internal combustion engine E when the battery 103 is in Zone DL. Further, the control instructing unit 161 prohibits the charge of the battery 103 by driving the electric motor M by the internal combustion engine E when the battery 103 is in Zone DH and restricts a regenerative operation of the electric motor M during deceleration. The restriction of the regenerative operation means gradually changing a ratio of a regenerative braking amount by a regenerative operation of the electric motor during deceleration to a normal braking amount in order to avoid a drastic change in braking amount that corresponds to a specific brake pedal effort. Namely, when prohibiting a regenerative operation in Zone DH, the braking force changes drastically since the regenerative braking amount becomes zero at the same time as the control SOC of the battery 103 shifts from Zone DL to Zone DH. However, as in this embodiment, by changing gradually the regenerative braking amount according to the control SOC of the battery 103 in Zone DH, the drastic change in braking force can be prevented.

Figure 6:
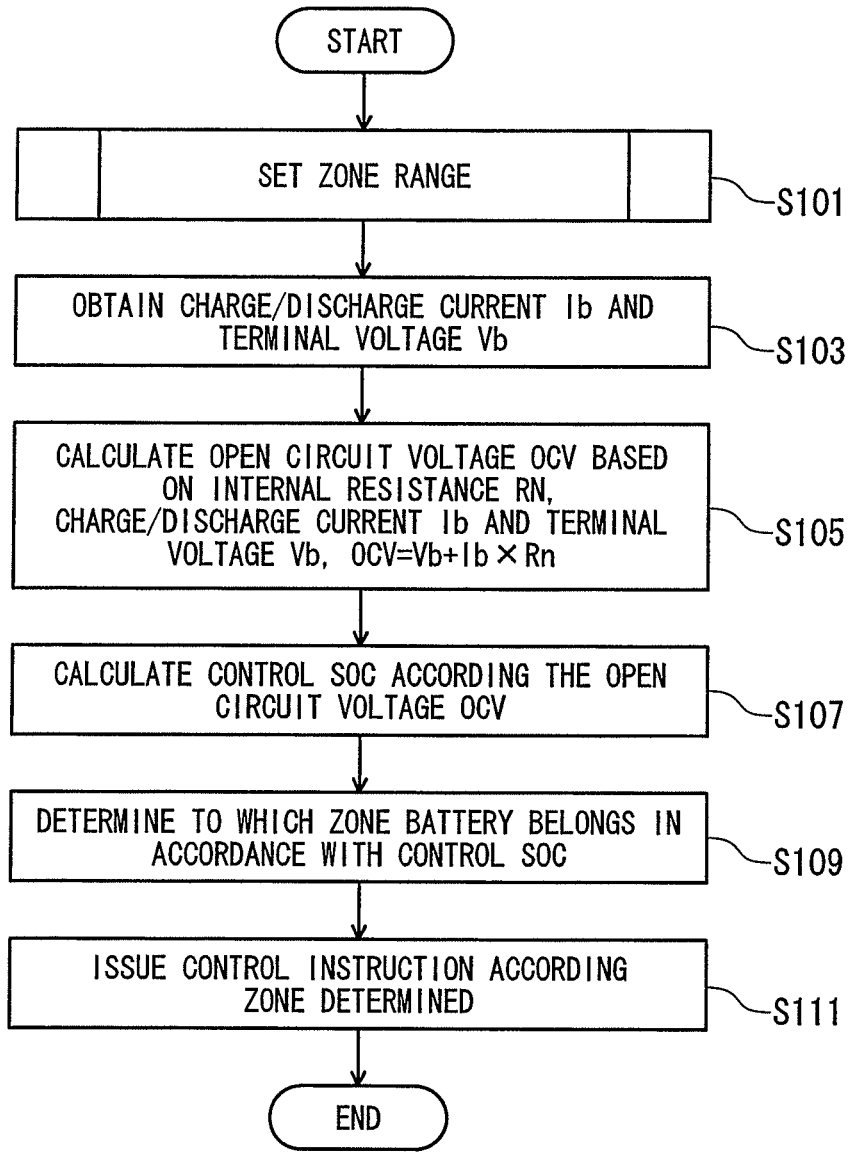
FIG. 6 is a flowchart showing the operation of the storage capacity management system 113.
Figure 7:
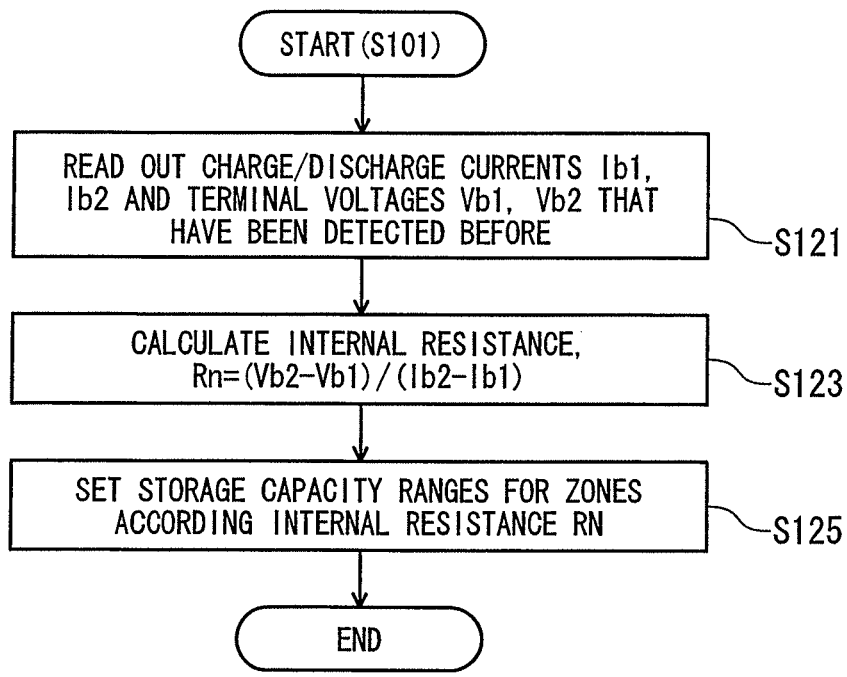
FIG. 7 is a flowchart showing in detail step S101 shown in FIG. 6.
Figure 8:
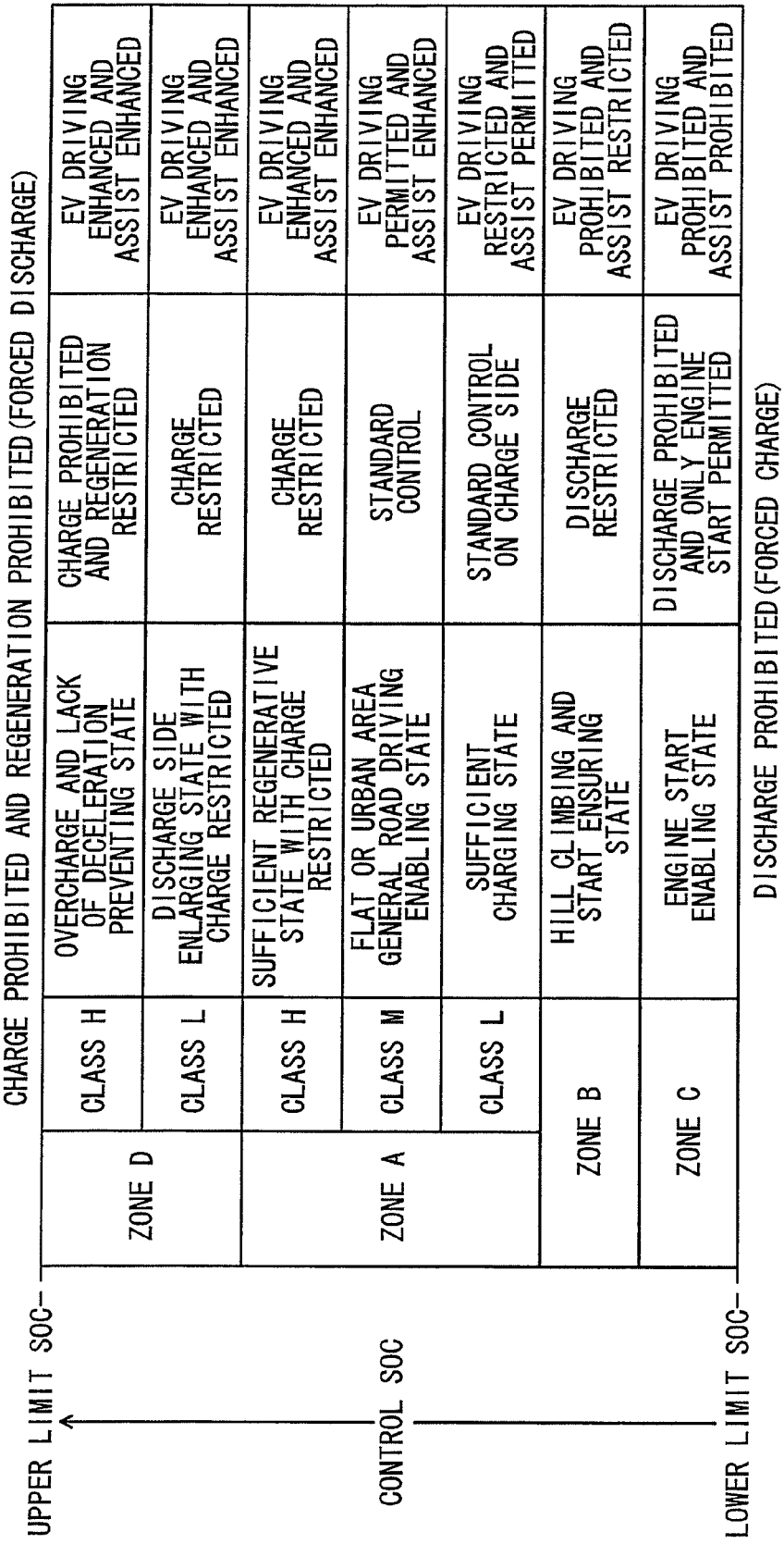
FIG. 8 is a diagram showing an example of a relationship between a range of the control SOC where the battery can be used and a plurality of zones thereof.
Figure 9:
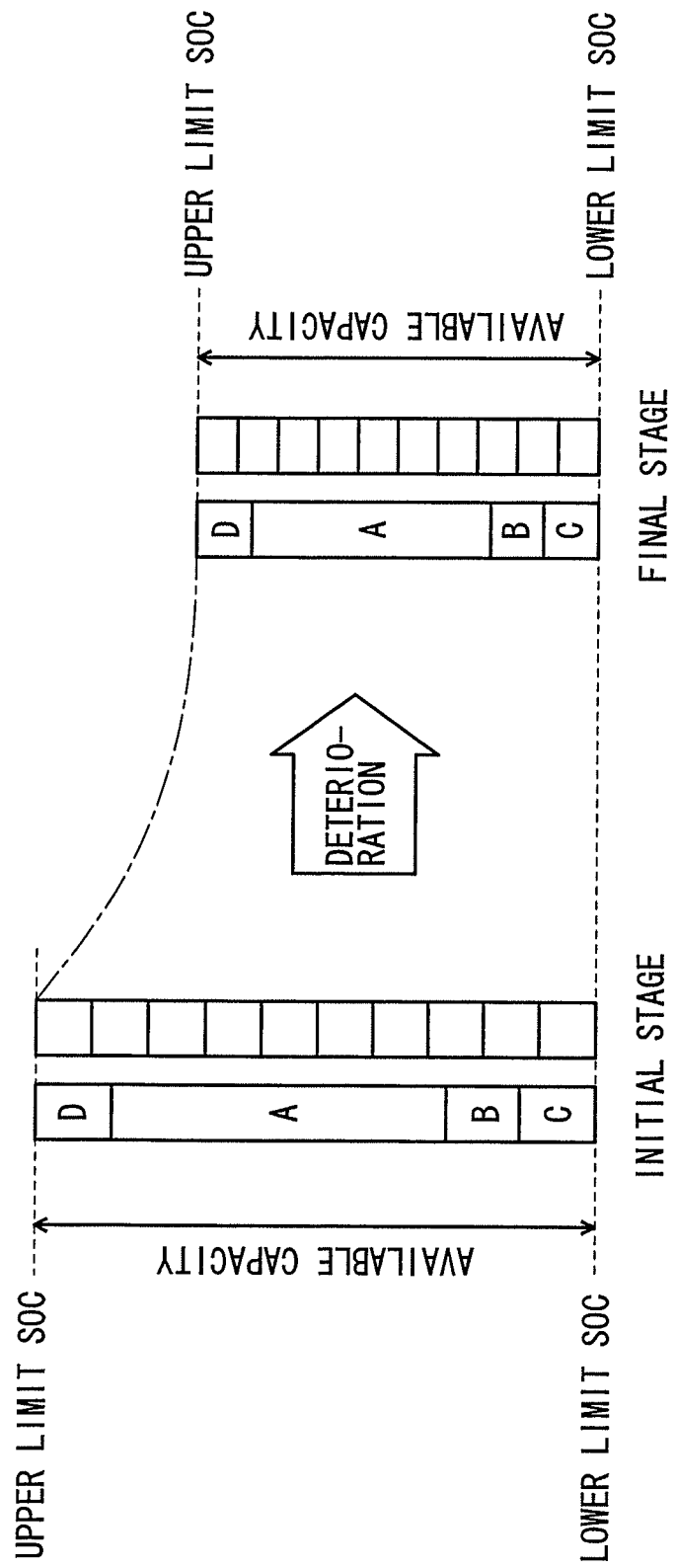
FIG. 9 is a diagram showing an example of a relationship between a change in available capacity of a battery and a plurality of zones of a control SOC that change in accordance with the change in state of the battery from an initial stage to a final stage thereof.

FIG. 6 is a flowchart showing the operation of the storage capacity management system 113. As shown in FIG. 6, the zone setting unit 155 sets ranges of the storage capacities of the zones by reference to the zone setting map (step S101). In step S101, as shown in FIG. 7, the internal resistance calculating unit 153 reads out the charge/discharge currents Ib1, Ib2 and terminal voltages Vb1, Vb2 of the battery 103 that have been detected before from the current/voltage information storage unit 121 (step S121). Next, the internal resistance calculating unit 153 calculates an internal resistance Rn of the battery 103 (step S123). Next, the zone setting unit 155 sets ranges of the storage capacities of the zones according to the internal resistance Rn calculated (step S125).

Next, the current/voltage acquiring unit 151 acquires information on the charge/discharge current Ib detected by the current sensor 105 and information on the terminal voltage Vb detected by the voltage sensor 107 (step S103). Next, the control SOC calculating unit 157 calculates an open circuit voltage OCV of the battery 103 based on the internal resistance Rn calculated in step 123, the charge/discharge current Ib and the terminal voltage Vb (step S105).

Next, the battery zone determination unit 159 calculates a control SOC of the battery 103 that corresponds to the open circuit voltage OCV (step S107). Further, the battery zone determination unit 159 determines to which zone the battery 103 belongs based on the zones set in step S101 and the control SOC calculated in step S107 (step S109). Next, the control instructing unit 161 issues to the electric power control unit 101 an instruction on control that corresponds to the zone determined in step S109 (step S111).

Thus, as has been described heretofore, the range of the storage capacity of Zone C that is set for the range of the control SOC where the battery 103 can be used affects electric power that is supplied to the electric motor M that starts the internal combustion engine E. Additionally, the range of the storage capacity of Zone B affects the hill climbing performance and the starting performance of the vehicle. In addition, the range of the storage capacity of Zone AM (Class M in Zone A) affects the fuel economy associated with the charge/discharge of the battery 103. Then, the range of the storage capacity of Zone DH affects the controlling performance of the battery 103 to prevent the battery 103 from being put in an overcharged state. In this embodiment, even though the battery 103 deteriorates, the ranges of the storage capacities of Zone C, Zone B, Zone AM and Zone DH stay unchanged in the event that the zone setting map shown in FIG. 3 is followed. In addition, the ranges of the storage capacities of Zone C, Zone B and Zone DH stay unchanged in the vent that the zone setting map shown in FIG. 4 is followed. Consequently, the performance of the battery 103 can be exhibited sufficiently by suppressing the influence of the deteriorated battery 103 to a minimum level.

The embodiment has been described as the vehicle being the HEV which is driven only by the driving force from at least one of the internal combustion engine E and the electric motor M. However, the invention can also be applied to an EV which is driven only by the driving force of an electric motor. Additionally, the invention can also be applied to a series HEV which is driven by the driving force of an electric motor which is driven by employing as a drive source electric power generated based on the power of an internal combustion engine.

While the invention has been described in detail and by reference to the specific embodiment, it is obvious to those skilled in the art to which the invention pertains that various alterations or modifications can be made thereto without departing from the spirit and scope of the invention.

This patent application is based on Japanese Patent Application (No. 2010-158743) filed on Jul. 13, 2010, the contents of which are incorporated herein by reference.

DESCRIPTION OF REFERENCE NUMERALS AND CHARACTER

E Internal combustion engine
M Electric motor
TM Transmission
W Driven wheels
101 Electric power control unit
103 Battery; 105 Current sensor
107 Voltage sensor
111 Memory
113 Storage capacity management system
121 Current/voltage information acquiring unit
123 Set zones storage unit
151 Current/voltage information acquiring unit
153 Internal resistance calculating unit
155 Zone setting unit
157 Control SOC calculating unit
159 Battery zone determination unit
161 Control instructing unit

The invention claimed is:

1. A storage capacity management system for a battery provided in a vehicle having an electric motor as a drive source, comprising:
   a deteriorated state estimating unit that estimates a deteriorated state of the battery based on an internal resistance of the battery;
   a zone setting unit that sets a storage capacity where the battery is used into a plurality of zones in accordance with a deteriorated state of the battery;
   a charged state calculating unit that calculates a charged state of the battery;
   a zone determination unit that determines to which zone of the plurality of zones set by the zone setting unit the charged state of the battery belongs; and
   a control instructing unit that instructs to execute a control associated with the charge or discharge of the battery in accordance with the zone determined by the zone determination unit, wherein
   a range of a storage capacity of at least one predetermined zone of the plurality of zones set by the zone setting unit stays constant throughout the full range of the deteriorated state of the battery based on the internal resistance of the battery, whereas ranges of storage capacities of zones other than the predetermined zone change according to the deteriorated state of the battery.

2. The storage capacity management system according to claim 1, wherein
   the ranges of the storage capacities of the zones other than the predetermined zone get narrower as the deteriorated state of the battery gets worse.

3. The storage capacity management system according to claim 1, wherein
   the control instructing unit restricts or prohibits the discharge of the battery in the predetermined zone.

4. The storage capacity management system according to claim 3, wherein:
   the vehicle has an internal combustion engine as a drive source in addition to the electric motor; and
   the control instructing unit prohibits the discharge of the battery but permits the discharge of the battery for starting the internal combustion engine by the electric motor in the predetermined zone.

5. The storage capacity management system according to claim 1, wherein
   the predetermined zone is the zone where the battery is charged or discharged with increased fuel economy in the plurality of zones.

6. The storage capacity management system according to claim 1, wherein:
   the vehicle has an internal combustion engine that can drive the electric motor so as to charge the battery; and
   the control instructing unit prohibits the charge of the battery by driving the electric motor by the internal combustion engine and restricts a regenerative operation of the electric motor while the vehicle is being decelerated.

7. The storage capacity management system according to claim 6, wherein
   when restricting the regenerative operation of the electric motor, the control instructing unit changes a ratio of a regenerative braking force to an overall braking force while the vehicle is being decelerated according to the charged state of the battery.

8. The storage capacity management system according to claim 1, wherein
the control instructing unit restricts the charge of the battery by driving the electric motor by the internal combustion engine in the zones other than the predetermined zone.

9. The storage capacity management system according to claim 1, wherein:
the vehicle has an internal combustion engine as a drive source in addition to the electric motor; and
the control instructing unit permits the charge of the battery and restricts the driving of the vehicle based only on a driving force from the electric motor in the zones other than the predetermined zone.

10. The storage capacity management system according to claim 2, wherein the control instructing unit restricts or prohibits the discharge of the battery in the predetermined zone.

11. The storage capacity management system according to claim 10, wherein:
the vehicle has an internal combustion engine as a drive source in addition to the electric motor; and
the control instructing unit prohibits the discharge of the battery but permits the discharge of the battery for starting the internal combustion engine by the electric motor in the predetermined zone.

12. The storage capacity management system according to claim 10, wherein:
the vehicle has an internal combustion engine that can drive the electric motor so as to charge the battery; and
the control instructing unit prohibits the charge of the battery by driving the electric motor by the internal combustion engine and restricts a regenerative operation of the electric motor while the vehicle is being decelerated.

13. The storage capacity management system according to claim 2, wherein:
the vehicle has an internal combustion engine that can drive the electric motor so as to charge the battery; and
the control instructing unit prohibits the charge of the battery by driving the electric motor by the internal combustion engine and restricts a regenerative operation of the electric motor while the vehicle is being decelerated.

14. The storage capacity management system according to claim 10, wherein:
the vehicle has an internal combustion engine that can drive the electric motor so as to charge the battery; and
the control instructing unit prohibits the charge of the battery by driving the electric motor by the internal combustion engine and restricts a regenerative operation of the electric motor while the vehicle is being decelerated.

15. The storage capacity management system according to claim 10, wherein:
the vehicle has an internal combustion engine that can drive the electric motor so as to charge the battery; and
the control instructing unit prohibits the charge of the battery by driving the electric motor by the internal combustion engine and restricts a regenerative operation of the electric motor while the vehicle is being decelerated.

* * * * *